US009983473B2

(12) United States Patent
Lin et al.

(10) Patent No.: US 9,983,473 B2
(45) Date of Patent: May 29, 2018

(54) PHOTOMASK AND METHOD FOR FABRICATING INTEGRATED CIRCUIT

(71) Applicant: TAIWAN SEMICONDUCTOR MANUFACTURING CO., LTD., Hsinchu (TW)

(72) Inventors: Chun-Yu Lin, Hsinchu (TW); Yi-Jie Chen, Hsinchu (TW); Feng-Yuan Chiu, Hsinchu County (TW); Ying-Chou Cheng, Zhubei (TW); Kuei-Liang Lu, Hsinchu (TW); Ya-Hui Chang, Hsinchu (TW); Ru-Gun Liu, Zhubei (TW); Tsai-Sheng Gau, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days. days.

(21) Appl. No.: 15/436,729

(22) Filed: Feb. 17, 2017

(65) Prior Publication Data

US 2017/0160633 A1     Jun. 8, 2017

Related U.S. Application Data

(62) Division of application No. 14/471,880, filed on Aug. 28, 2014, now Pat. No. 9,612,526.

(51) Int. Cl.
| | | |
|---|---|---|
| *G03F 1/36* | (2012.01) | |
| *G03F 1/42* | (2012.01) | |
| *G03F 7/038* | (2006.01) | |
| *G06F 17/50* | (2006.01) | |

(52) U.S. Cl.
CPC .................. *G03F 1/42* (2013.01); *G03F 1/36* (2013.01); *G03F 7/038* (2013.01); *G06F 17/5072* (2013.01)

(58) Field of Classification Search
CPC ... G03F 1/36; G03F 1/42; G03F 7/038; G03F 7/5072; G06F 17/5072
USPC ........................................................ 430/5, 30
See application file for complete search history.

(56) References Cited

U.S. PATENT DOCUMENTS

| | | | |
|---|---|---|---|
| 6,340,635 B1 | 1/2002 | Toyota et al. | |
| 6,818,480 B2 | 11/2004 | Lee et al. | |
| 7,500,218 B2 | 3/2009 | Troost et al. | |
| 9,116,433 B2 | 8/2015 | Vannuffel et al. | |
| 2004/0021221 A1 | 2/2004 | Lee et al. | |

FOREIGN PATENT DOCUMENTS

| | | |
|---|---|---|
| JP | 2000-156377 A | 6/2000 |
| KR | 10-2004-0012351 A | 2/2004 |
| KR | 10-2006-0050525 A | 5/2006 |
| KR | 10-2008-0000975 A | 1/2008 |
| KR | 10-2010-0028244 A | 3/2010 |

*Primary Examiner* — Christopher G Young
(74) *Attorney, Agent, or Firm* — Maschoff Brennan

(57) ABSTRACT

A photomask and method for fabricating an integrated circuit is provided. A design layout is provided, wherein the design layout has a plurality of main features. A plurality of assistant features are added in an assistant region of the design layout to form a first layout, wherein the assistant region has no main feature and a width of the assistant region is larger than five times of a width of the main feature. A plurality of optical proximity correction (OPC) features are added on the first layout to form a second layout. And a photomask is formed according to the second layout.

20 Claims, 7 Drawing Sheets

PHOTOMASK AND METHOD FOR FABRICATING INTEGRATED CIRCUIT

CROSS-REFERENCE TO RELATED APPLICATION

The present application is a Divisional Application of the U.S. application Ser. No. 14/471,880, filed Aug. 28, 2014, which is herein incorporated by reference.

BACKGROUND

Photolithography process in semiconductor manufacturing includes a process to pattern a photoresist. In this process, the photoresist is disposed on a substrate and exposed by a light through a photomask. The photomask includes a design pattern having main features formed according to a design layout of integrated circuits. After the exposure, the photoresist is developed to form a projected pattern therein same as the design patter of the photomask. In the process, an optical proximity effect (OPE), which interferes the critical dimension (CD) of the linewidth of the projected pattern, may deviate the projected pattern formed on the photoresist from the design pattern of the photomask. Various optical proximity correction (OPC) techniques are utilized to decrease the deviation, such as simulating the design layout with an OPC model to from a corrected layout. Although existing process have been generally adequate for the intended purposes, it is not entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
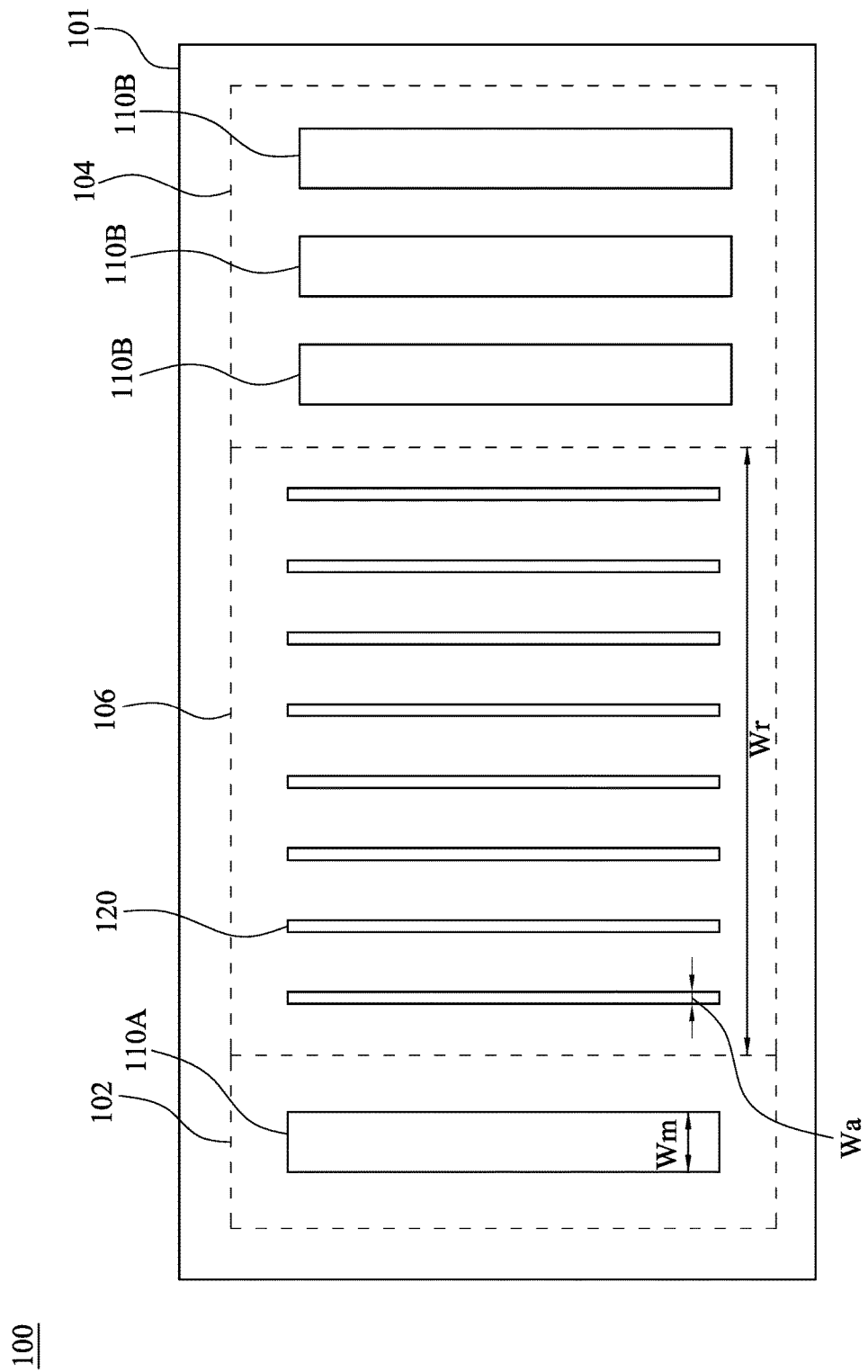
FIG. 1 is a top view of a photomask, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Assistant features are features that are not intended to appear in the projected pattern but are provided in the mask to develop image more closely resemble to the design layout. Assistant features are generally "sub-resolution" or "deep sub-resolution," meaning that they are smaller in at least one dimension than the smallest main feature in the photomask that will actually be resolved on the wafer.

In some embodiments, the design layout may be stimulated by the OPC model to form a corrected layout. Then a photomask is formed with the corrected layout. The photomask then is used to pattern a wafer or a substrate with a photoresist on it by a light. The projected pattern on the photoresist than be developed. The formed projected pattern then is compared with the design pattern, for forming new data for the OPC model. Then the OPC model may be calibrated and have more accuracy in stimulating the OPE.

The OPC model can stimulate the OPE for the design layout to make the projected pattern have more accurate CD. But the CD deviation formed by mechanical effect of the photoresist cannot be stimulated by the OPC model. For example, the projected pattern formed on a negative photoresist may have larger linewidth by the shrinkage of the negative photoresist. When the negative photoresist is exposed by light, the exposed negative photoresist may cross-link and form stress to the pattern, and the stress may affect the CD of the projected pattern. The OPC model cannot stimulate the mechanical effect, which includes the stress effect, the projected pattern formed on the negative photoresist cannot fit into the OPC model, therefore the projected pattern cannot be used to calibrate the OPC model. The photomask therefore cannot be further calibrated to form the projected pattern with better CD.

Therefore, a photomask and a method for fabricating an integrated circuit are provided. Referring to FIG. 1, FIG. 1 is a top view of a photomask, in accordance with some embodiments. A photomask 100 includes a plurality of main features 110, which includes 110A and 110B on a substrate 101. The photomask 100 may be a binary mask (BIM), a super binary mask (SBIM), or a phase shift mask (PSM), which includes an alternative phase shift mask (alt. PSM) or an attenuated phase shift mask (att. PSM). The main features 110 are enclosed in a first region 102 and a second region 104. The first region 102 includes single the main feature 110A; and the second region 104 includes multiple the main features 110B. A plurality of assistant features 120 are formed between the first region 102 and the second region 104. The main features 110 forms a pattern which will be projected on a negative photoresist on a substrate to form a projected pattern. The assistant features 120 have a linewidth $w_a$ smaller than that of the main feature $w_m$ in at least one dimension, therefore the assistant features 120 may not be shown on the projected pattern. The assistant features 120 are used to alleviate the mechanical effect on the negative photoresist. In some embodiments, the main feature 110A in the first region 102 is an isolated feature; and the main features 102B in the second region 104 are dense features. The dense features have an aspect ratio of the linewidth of the main feature over the distance between the two main features larger than ⅕; and the isolated feature has an aspect ratio of the linewidth of the main feature over the distance between the two main features smaller than ⅕. The main features 110 are parallel stripes, and the assistant features 120 are substantially in parallel with the main features. In some embodiments, an assistant region 106 is defined. The assistant region 106 is a region having a width $w_r$ larger than 5 times of the linewidth $w_m$ of the main feature 110 and having a plurality of assistant features 120 but have no main feature 110 on it. In some embodiments, the assistant region 106 may between a first region 102 and a second region 104.

Figure 2:
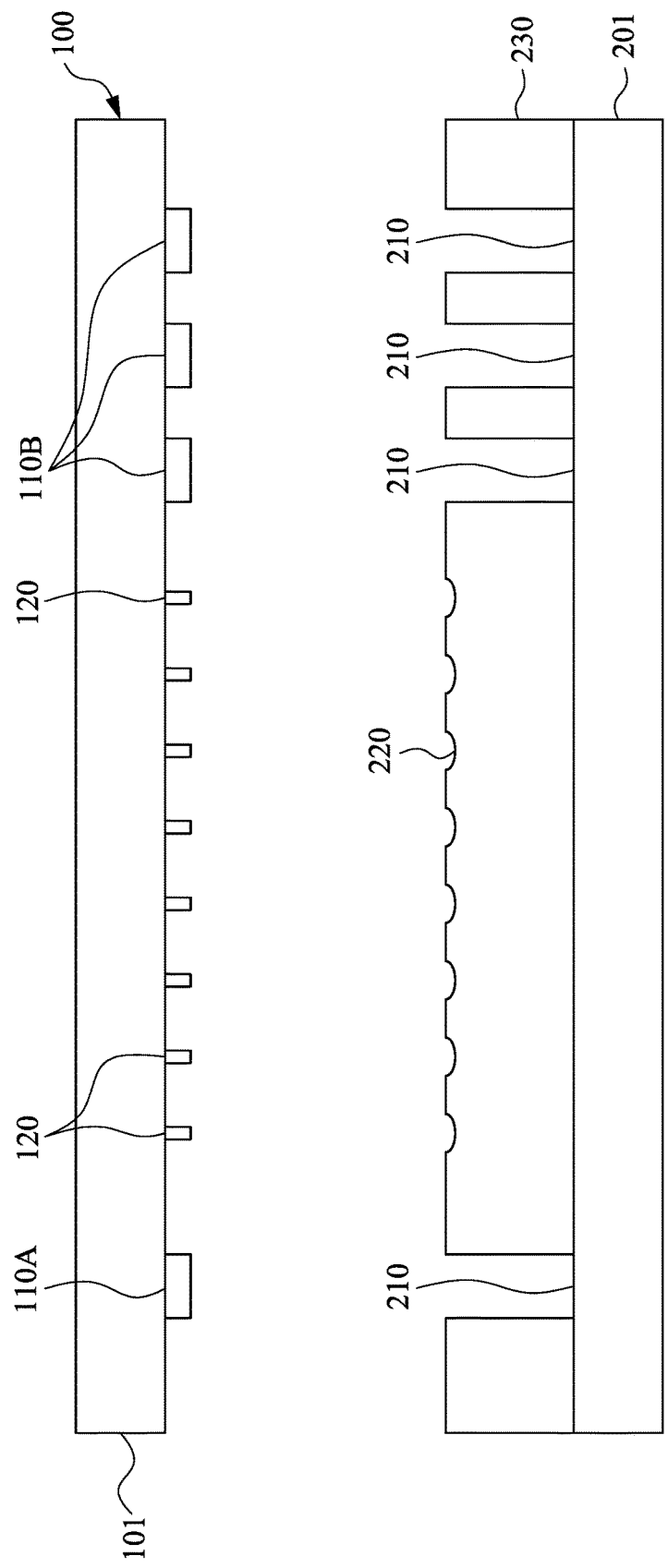
FIG. 2 is a cross-sectional view of a photomask and a projected pattern on a wafer, in accordance with some embodiments.

Referring to FIG. 2, FIG. 2 is a cross-sectional view of a photomask and a projected pattern on a wafer, in accordance with some embodiments. The figure shows a cross-sectional view of the photomask 100 the same with the embodiments in FIG. 1, and a photoresist layer 230 patterned by the photomask 100. The photoresist layer 230 is formed on a substrate 201. The photoresist layer 230 includes a negative photoresist. The substrate 201 may be a wafer or a wafer having semiconductor devices or a plurality of layers. In the exposing process, the light passes through the photomask 100 and exposes the photoresist layer 230. The exposed photoresist layer 230 may cross-link and solidify. Some light is hindered by the main features 110, and the parts of the photoresist layer 230 under the main features 110 are not exposed. After developing process, the part of photoresist layer 230 which is not exposed are removed to form a projected pattern including a plurality of trenches 210. Also, some light is hindered by the assistant features 120, but the assistant features 120 are sub-resolution features, only a plurality of dimples 220 are formed on the photoresist layer 230, not the smaller trenches are formed on the photoresist layer. The dimples 220 formed by the assistant features 120 may destruct the cross-link on the top surface 232 of the photoresist layer 230, and reduce the stress formed by the cross-link of the negative photoresist. The dimples 220 are only formed on the top surface 232 of the photoresist layer 230, and may not penetrate the photoresist layer. The stress in the photoresist layer may broaden the opening of the trenches 210, which makes a CD deviation, and makes the projected pattern on the photoresist layer 230 cannot be further stimulated by an OPC model. Therefore, the assistant features decrease the stress on the top surface 232 of the photoresist layer 230; make the trenches have the same linewidth with the main features in the design layout.

Figure 3:
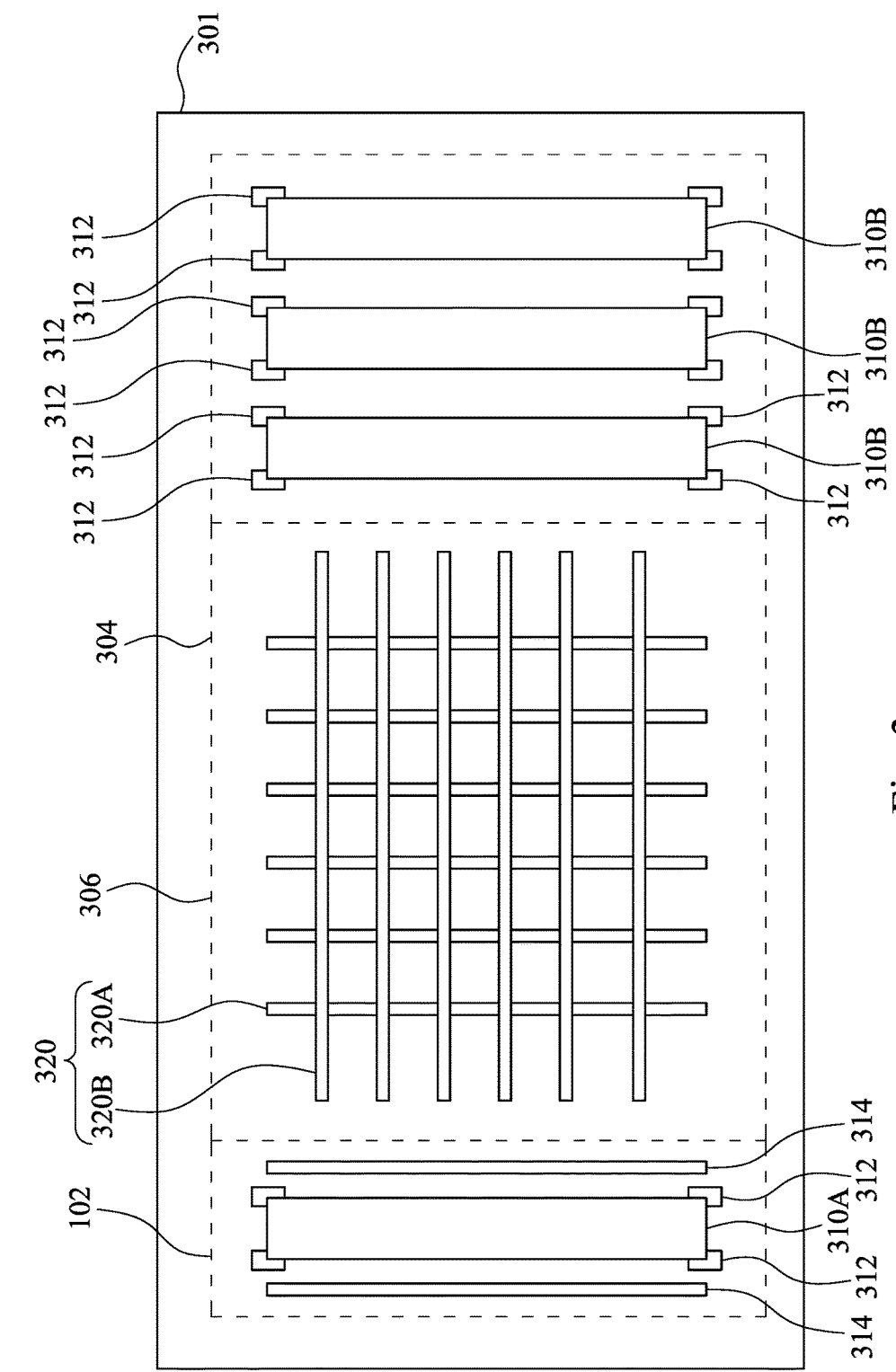
FIG. 3 is a top view of a photomask, in accordance with some embodiments.

Referring to FIG. 3, FIG. 3 is a top view of a photomask, in accordance with some embodiments. A photomask 300 includes a plurality of main features 310, which includes 310A and 310B on a substrate 301. The main features 310 are enclosed in a first region 302 and a second region 304. The first region 302 includes single the main feature 310A; and the second region 304 includes multiple the main features 310B. A plurality of scattering bars 314 are in the first region 302 adjacent to the main feature 310A. The scattering bars 314 are used to enhance the resolution and depth of focus of the photolithography process. A plurality of optical proximity correction (OPC) features 312 are formed in contact with the main features 310. The OPC features 312 are based on the stimulation of the design layout by the OPC model to calibrate the OPE, and makes the projected pattern the same with the design layout. The OPC features 312 may include serifs added to line corners, jogs or extensions added to feature-ends. In some embodiments, the OPC features 312 are in contact with four corners of the main feature or periphery of the main feature. A plurality of assistant features 320, which includes a plurality of first assistant features 320A and a plurality of second assistant features 320B are formed between the first region 302 and the second region 304. The first assistant features 320A and second assistant features 320B respectively are in shape of stripe, and the first assistant features 320A and the second assistant features 320B are substantially perpendicular and crossed with each other to form a plaid pattern. The assistant features 320 may decrease the stress of the photoresist in a direction substantially perpendicular with the assistant feature 320. Therefore, when the first assistant features 320A and the second assistant features 320B are substantially in perpendicular with each other, the stress in the two directions substantially perpendicular with the assistant feature 320 may be eliminated. In some embodiments, the assistant features 320 are enclosed in an assistant region 306, and the assistant region 306 has no main features 310 in it.

Figure 4:
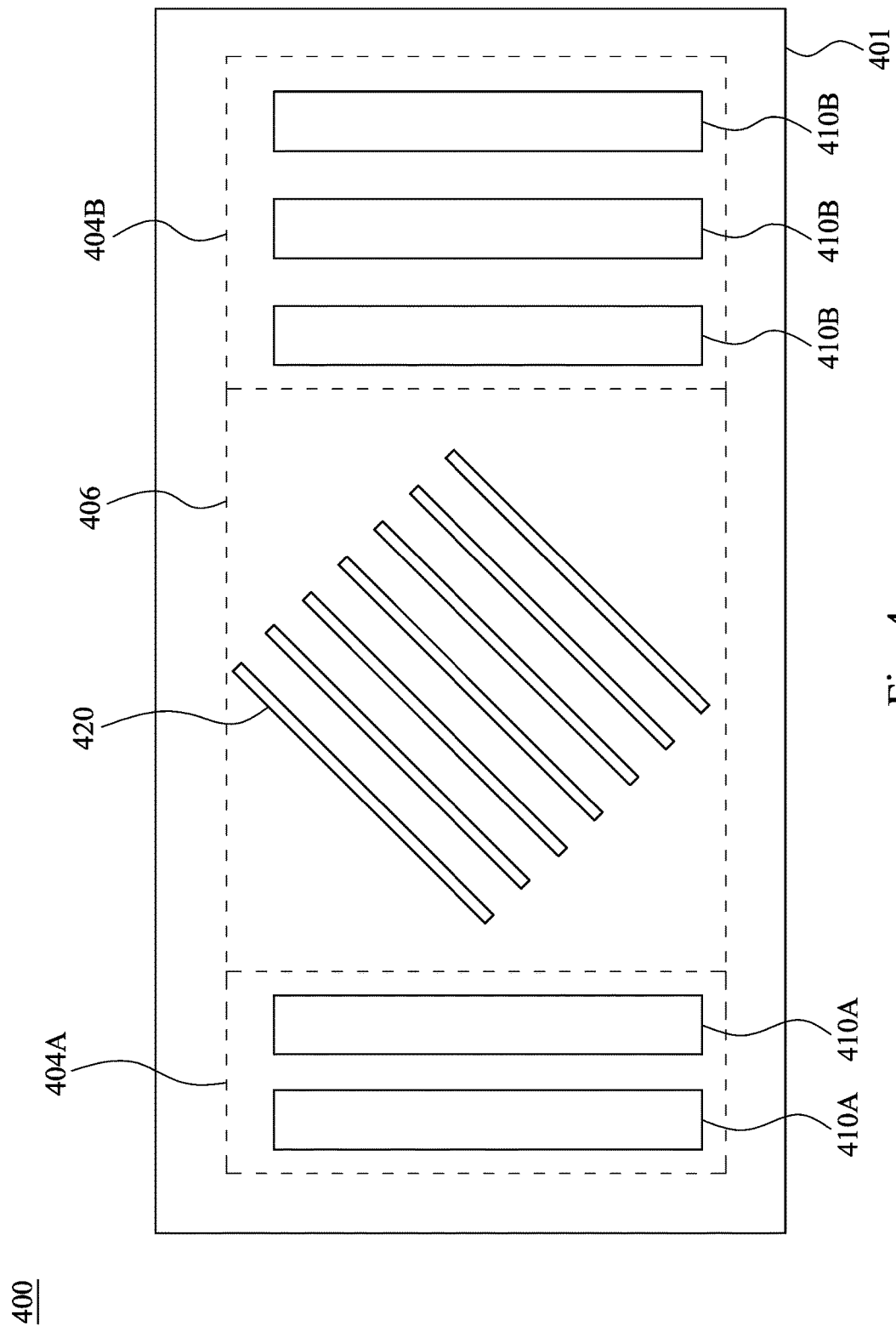
FIG. 4 is a top view of a photomask, in accordance with some embodiments.

Referring to FIG. 4, FIG. 4 is a top view of a photomask, in accordance with some embodiments. A photomask 400 includes a plurality of main features 410, which includes 410A and 410B on a substrate 401. The main features 410 are enclosed in a two second regions 404A, 404B. The second region 404A, 404B include multiple the main features 410. A plurality of assistant features 420 are formed between the two second region 404A, 404B. The assistant features 420 are arranged substantially in parallel but not in parallel with the main features 410. Due to the assistant features 420 are formed to decrease the stress in the photoresist, the assistant features 420 needs not to arrange in parallel with the main features 410 like the scattering bars. The shape and the direction of the assistant features 420 have no limitation, only not to be exposed to form trenches on the photoresist layer.

Figure 5:
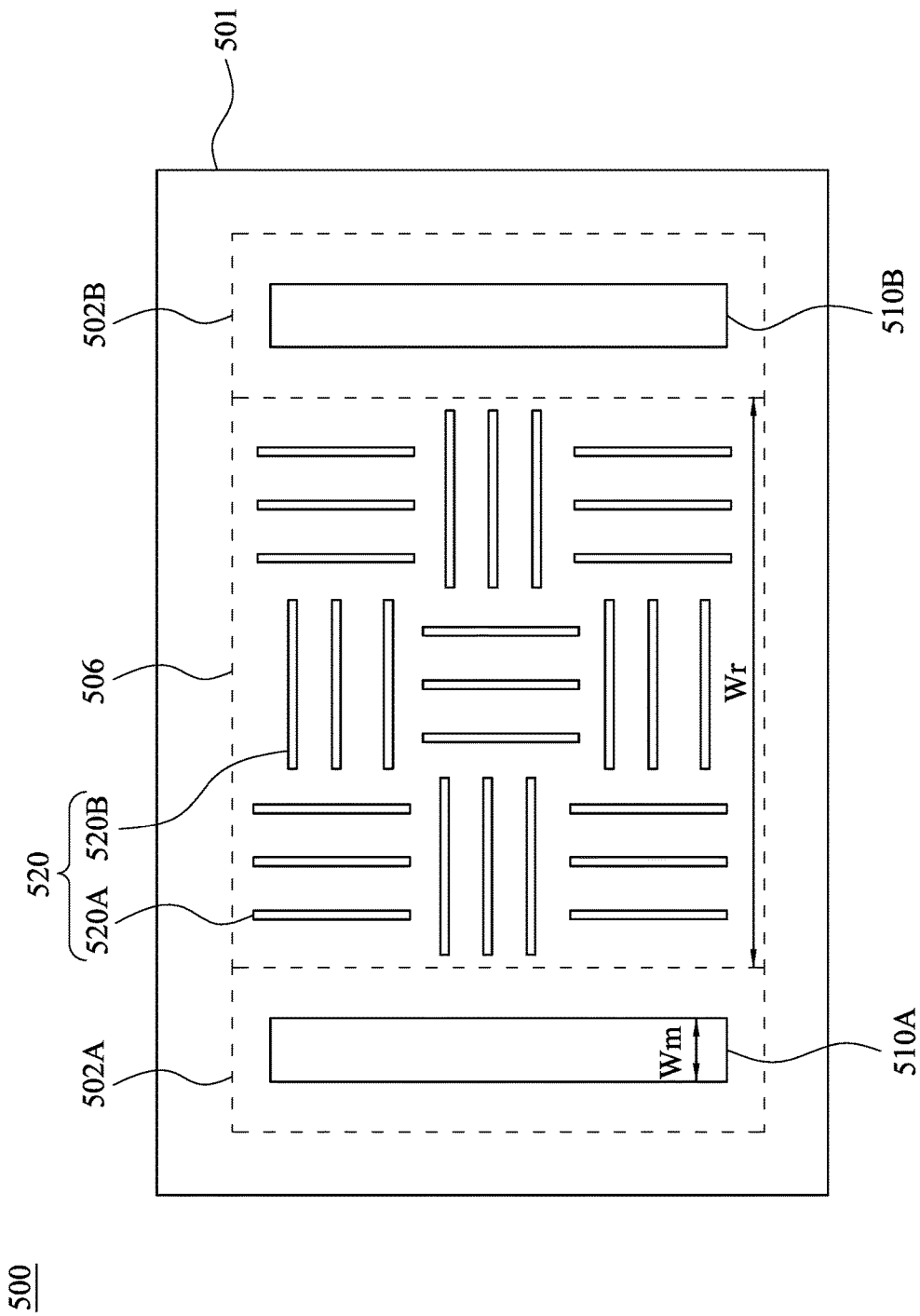
FIG. 5 is a top view of a photomask, in accordance with some embodiments.

Referring to FIG. 5, FIG. 5 is a top view of a photomask, in accordance with some embodiments. A photomask 500 includes two main features 510A, 510B on a substrate 501. The main feature 510A is enclosed in a first regions 502A; the main feature 510B is enclosed in a first regions 502B. The first region 502A, 502B include single the main feature 510A, 510B, respectively. A plurality of assistant features 520 are enclosed in an assistant region 506, wherein the assistant region 506 is between the two first regions 502A, 502B. The assistant region 506 is a region having no main features 510 in it, and the width of the assistant region 506 $w_r$ is larger than five times of a width of the main feature 510 $w_m$. In some embodiments, the width of the assistant region 506 $w_r$ is larger than 50 nm. When the negative photoresist has a cross-link area having a side length larger than 50 nm, the stress may affect the linewidth near the area. In some embodiments, the width of the assistant region 506 $w_r$ is larger than 300 nm. When the negative photoresist has a cross-link area having a side length larger than 300 nm, the stress effect may become apparent. The assistant features 520, which includes a plurality of first assistant features 520A and a plurality of second assistant features 520B are formed in the assistant region 506. The first assistant features 520A and second assistant features 520B respectively are in shape of stripe, and the first assistant features 520A are arranged substantially in parallel to form a first series, and the second assistant features 520B are arranged substantially in parallel to form a second series, but the first assistant features 520A and the second assistant features 520B are substantially in perpendicular. The two series are repeated and forms a checkered pattern.

Figure 6:
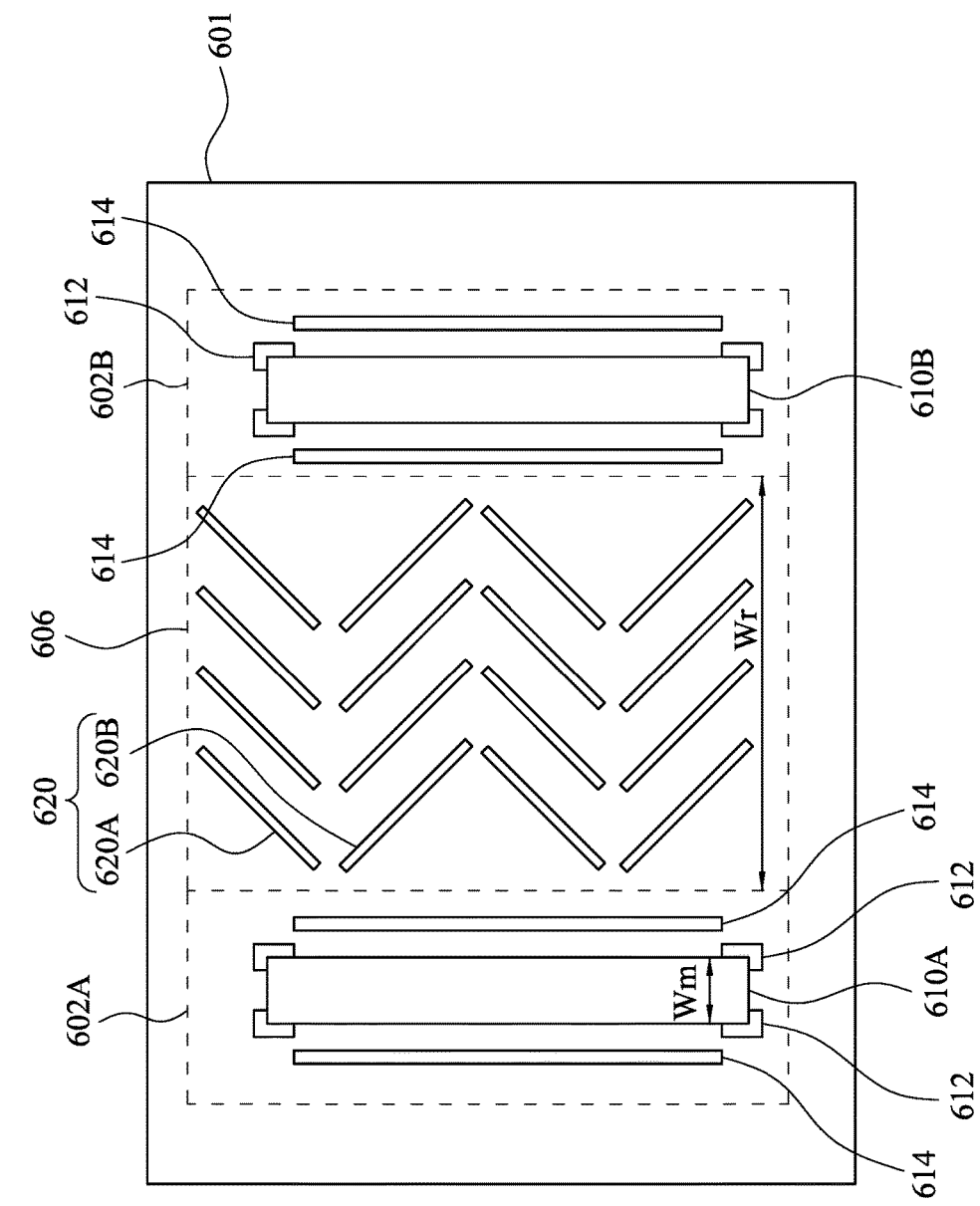
FIG. 6 is a top view of a photomask, in accordance with some embodiments.

Referring to FIG. 6, FIG. 6 is a top view of a photomask, in accordance with some embodiments. A photomask 600 includes two main features 610A, 610B on a substrate 601. The main feature 610A is enclosed in a first regions 602A; the main feature 610B is enclosed in a first regions 602B.

The first region 602A, 602B include single the main feature 610A, 610B, respectively. A plurality of assistant features 620 are enclosed in an assistant region 606, wherein the assistant region 606 is between the two first regions 602A, 602B. The assistant region 606 is a region having no main features 610 in it, and the width of the assistant region 606 $w_r$ is larger than five times of a width of the main feature 610 $w_m$. In some embodiments, the width of the assistant region 506 $w_r$ is larger than 50 nm. In some embodiments, the width of the assistant region 506 $w_r$ is larger than 300 nm. The assistant features 620 include a plurality of first assistant features 620A and a plurality of second assistant features 620B. The first assistant features 620A and second assistant features 620B respectively are in shape of stripe, and the first assistant features 620A are arranged substantially in parallel and the second assistant features 620B are substantially arranged in parallel, a series of the first assistant features 620A are intermixed with a series of the second assistant features 620B. And the assistant features 620 are not in parallel with the main features 610. A plurality of scattering bars 614 are in the first regions 602A, 602B and adjacent to the main features 610A, 610B. A plurality of OPC features 612 are formed in contact with the main features 610, for example, at corners of the main feature 610.

According to various embodiments of the present disclosure, the assistant features have no limitation for their shapes. Due to the assistant features are added for decreasing the stress effect of the negative photoresist, not added for correcting OPE. The shape and the arrangement of the assistant features may be stripes the same with the above-mentioned embodiments, stripes in various different directions, different kinds of ring-shape, curves, or combinations thereof. Only the linewidth of the assistant features need to be sub-resolution, and the assistant features may not disposed too close to the main features to affect the resolution or the shape of the main features.

Figure 7:
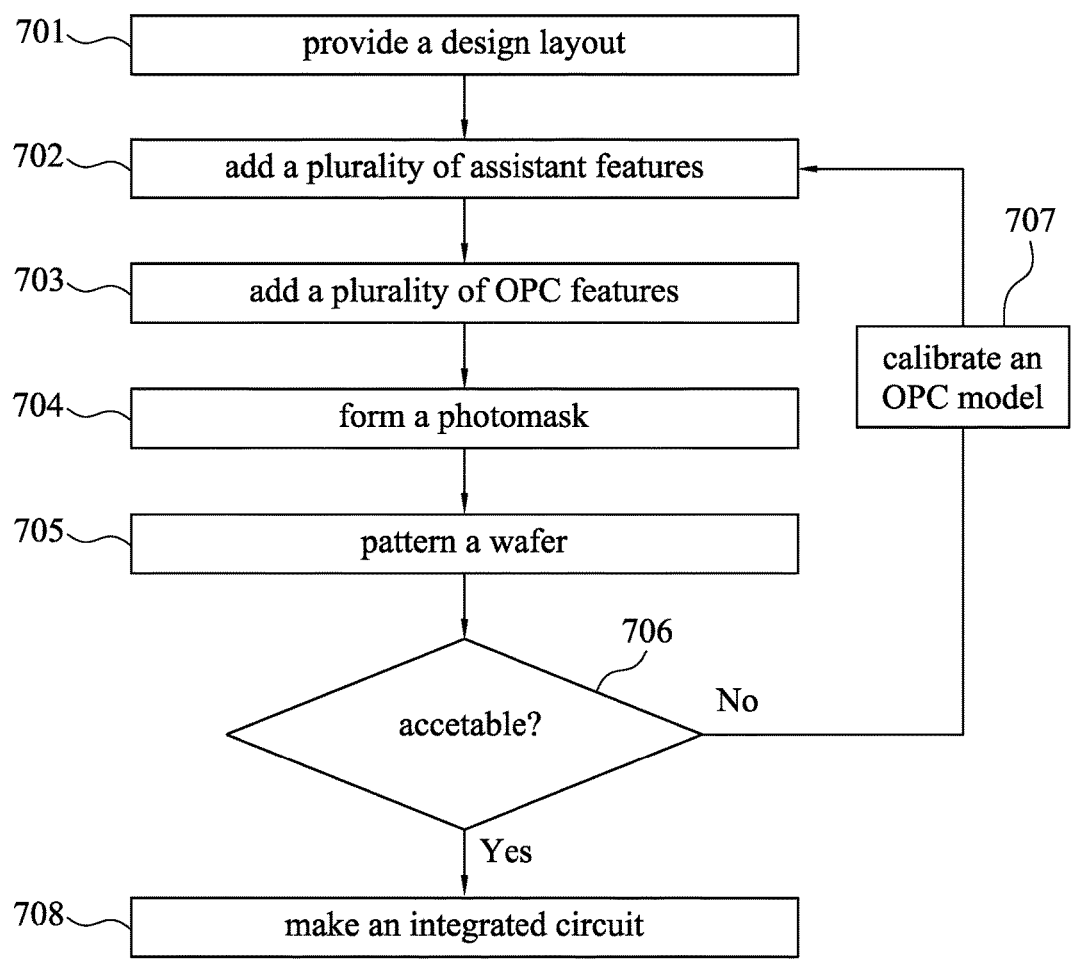
FIG. 7 is a flow chart of designing an integrated circuit, in accordance with some embodiments.

Referring to FIG. 7, FIG. 7 is a flow chart of fabricating an integrated circuit, in accordance with some embodiments. Method 700 begins at operation 701 providing a design layout. The design layout includes a plurality of main features. For example, a portion of the design layout may include various main features, such as active region, gate electrode, source and drain, metal lines and vias of an interlayer interconnection, and openings for bonding pads, to be formed in and on a semiconductor substrate and various material layers disposed over the semiconductor substrate.

Operation 702 includes adding a plurality of assistant features in an assistant region of the design layout to form a first layout, wherein the assistant region has no main feature and a width of the assistant region is larger than five times of a width of the main feature. The assistant features are enclosed in the assistant region for decreasing the stress effect in the negative photoresist, which may affect the CD. The assistant region is a region having no main features in it, and the width of the assistant region is larger than five times of a width of the main feature closest to the assistant region. In some embodiments, the width of the assistant region is larger than 50 nm. When the negative photoresist has a cross-link area having a side length larger than 50 nm, the stress may affect the linewidth near the area. In some embodiments, the width of the assistant region is larger than 300 nm. When the negative photoresist has a cross-link area having a side length larger than 300 nm, the stress effect may become apparent. A shape and the arrangement of the assistant features have no limitations, only the linewidth of the assistant features need to be sub-resolution, which means the assistant features will not be exposed on the photoresist. The shape of the assistant features may be strips, curve, rings, or combinations thereof. The arrangement of the assistant features may be substantially parallel, perpendicular, or arranged in other angles with the main feature. The design layout than become a first layout after adding the assistant features in the assistant region.

Operation 703 includes adding a plurality of OPC features on the first layout to form a second layout. OPC features are formed to correct OPE to make the shape and the CD of the projected pattern become to the same with the design layout. The design layout is stimulated by an OPC program with an OPC model to form the OPC features by the main features. The OPC features are in contact with the main features. The OPC features may be serifs added to the feature corners, jogs or extensions added to feature-ends. In some embodiments, scattering bars are formed adjacent to the main features to enhance the resolution of the main features. The first layout than become a second layout after the OPC features are formed on the first layout.

Operation 704 includes forming a photomask according to the second layout. The photomask is formed according to the second layout, and the photomask includes main features, assistant features, and OPC features. In some embodiments, the photomask is formed by photolithography process. The photomask may be a binary mask (BIM), a super binary mask (SBIM), or a phase shift mask (PSM).

Operation 705 includes patterning a wafer having a negative photoresist by the photomask to form a projected pattern. The projected pattern is formed by a photolithography process. The projected pattern is formed on a negative photoresist and includes main features, assistant features, and OPC features. The assistant feature may destruct the stress on the surface of the negative photoresist, and improve the CD of the main features and make the projected pattern fit the OPC model.

The method proceeds to operation 706 by determining if a projected pattern on the wafer is acceptable in comparison with the design layout. The projected pattern is measured and compared with the designed layout. If the difference between the projected pattern and the design layout is acceptable, which satisfy a product standard, the method 700 proceeds to operation 708. For example, the CD difference between the projected pattern and the design layout is acceptable when the CD of the projected pattern is the same with the designed layout. The operation 708 includes making the integrated circuit by the photomask. The wafer with the projected pattern is than operated by other procedures, such as etching, depositing and other operations to form the integrated circuit. If the difference between the projected pattern and the design layout is not acceptable, the method 700 proceeds to operation 707.

The operation 707 includes calibrating an OPC model with the projected pattern. The OPC model is calibrated according the data of the difference between the projected pattern and the design layout. After calibrating the OPC model, the method proceeds to operations 702 to 706 again. By using the calibrated OPC model, the operations 702 to 706 including: A plurality of calibrated assistant features are added on the design layout to form a first revised layout. A plurality of calibrated OPC features are added on the first revised layout to form a second revised layout. A revised photomask is formed according to the second revised layout. A wafer having a negative photoresist is patterned by the revised photomask to form a revised projected pattern. And determining if the revised projected pattern on the wafer is acceptable in comparison with the design layout. Because the calibrated OPC model is used, the OPC features and assistant features stimulated by the OPC program may change to form the calibrated assistant features and the calibrated OPC features in the design layout to form the second revised layout. The revised photomask formed with the second revised layout is then used to pattern another wafer having the negative photoresist and form the revised projected pattern. The revised projected pattern is then comparing to the design layout to see the difference between the two layouts is acceptable or not. If the difference is acceptable, the method 700 proceeds to operation 708 by making the integrated circuit by the photomask; and if the difference is not acceptable, the method 700 proceeds to operation 707 again by calibrating the OPC model with the projected pattern.

In various embodiments of the present disclosure, a plurality of test patterns are formed on a layout and patterned on a wafer to determine an assistant feature design rule. The test patterns may include main features with different shapes and assistant features in different arrangements or in different distances to the main features. And the CD differences and the shape differences of the test patterns on the layout and the test patterns on a wafer are calculated by a computer to determine the assistant feature design rule. The assistant feature design rule may provide information about how to add the assistant features can decrease the stress effect for the main features. Once the assistant feature design rule is determined, the method 700 may be simplified by neglecting the operations 706 and 707. The operation 701 includes providing a design layout. The operation 702 includes adding a plurality of assistant features in an assistant region of the design layout to form a first layout. The assistant features are added according to the assistant feature design rule to make sure the stress effect on the projected pattern may be eliminated. And the operation 703 includes adding a plurality of OPC features on the first layout to form a second layout. The OPC features formed by the OPC model may ensure the OPE may be decreased and the formed main features in the projected pattern is the same with that of the design layout. Therefore the operation 706 for inspection and the operation 707 for calibration may be neglected. The formed photomask in operation 704 may direct use to fabricate the integrated circuit. Operation 705 includes patterning a wafer having a negative photoresist by the photomask to form the projected pattern. The operation 708 includes making the integrated circuit by the photomask.

The method 700 for fabricating an integrated circuit forms the photomask having the assistant feature in the assistant region. The photomask may form projected pattern without stress effect by the negative photoresist, make the projected pattern have better CD. Therefore the projected pattern may fit well with the OPC model, which facilitates the IC design.

In various embodiments of the present disclosure, a photomask including a plurality of main features; at least one first region, wherein the first region includes one main feature; at least one second region, wherein the second region includes the plurality of main features; and a plurality of assistant features disposed between the first region and the second region, or the two second regions.

In various embodiments of the present disclosure, a photomask includes two main features, enclosed in two first regions, wherein the first region includes single the main feature; and a plurality of assistant features enclosed in an assistant region, wherein the assistant region is between the two first regions, and the width of the assistant region is larger than five times of a width of the main feature.

In various embodiments of the present disclosure, a method for fabricating an integrated circuit includes the following operations. A design layout is provided, wherein the design layout has a plurality of main features. A plurality of assistant features are added in an assistant region of the design layout to form a first layout, wherein the assistant region has no main feature and a width of the assistant region is larger than five times of a width of the main feature. A plurality of optical proximity correction (OPC) features are added on the first layout to form a second layout. And a photomask is formed according to the second layout.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating an integrated circuit, comprising:
   providing a design layout, wherein the design layout has a plurality of main features;
   adding a plurality of assistant features in an assistant region of the design layout to form a first layout;
   forming a photomask according to the first layout; and
   patterning a photoresist on a wafer by the photomask to form a projected pattern that includes a plurality of dimples on a top surface of the photoresist.

2. The method of claim 1, further comprising:
   determining if the projected pattern is acceptable in comparison with the design layout; and
   making the integrated circuit by the photomask when the projected pattern is acceptable.

3. The method of claim 1, further comprising:
   adding a plurality of optical proximity correction (OPC) features on the first layout, wherein the optical proximity correction (OPC) features are in contact with the main features.

4. The method of claim 1, wherein the assistant features are sub-resolution features.

5. The method of claim 1, wherein the width of the assistant region is larger than 50 nm.

6. The method of claim 2, after determining if the projected pattern is acceptable and before making the integrated circuit, further comprising:
   calibrating an OPC model with the projected pattern if the projected pattern is not acceptable.

7. The method of claim 6, further comprising:
   adding a plurality of calibrated assistant features on the design layout to form a first revised layout;
   adding a plurality of calibrated OPC features on the first revised layout to form a second revised layout;
   forming a revised photomask according to the second revised layout;
   patterning a wafer having a photoresist by the revised photomask to form a revised projected pattern; and
   determining if the revised projected pattern is acceptable in comparison with the design layout.

8. A method for fabricating an integrated circuit, comprising:

providing a photomask having a design layout, and the design layout comprising a plurality of main features and a plurality of assistant features, wherein the assistant features are in an assistant region of the design layout, and the assistant region has no main feature and a width of the assistant region is larger than five times of a width of the main feature; and patterning a photoresist on a wafer by the photomask to form a projected pattern, wherein the assistant features form a plurality of dimples on a top surface of the photoresist and the main features form a plurality of trenches penetrating through the photoresist.

9. The method of claim 8, wherein the assistant features are sub-resolution features.

10. The method of claim 8, wherein the width of the assistant region is larger than 50 nm.

11. The method of claim 8, wherein the design layout further comprises a plurality of optical proximity correction (OPC) features, and the optical proximity correction (OPC) features are in contact with the main features.

12. The method of claim 8, wherein the assistant features comprise:
   a plurality of first assistant features; and
   a plurality of second assistant features,
   wherein the first assistant features and the second assistant features respectively are in shape of stripe, and the stripes of the first assistant features and the stripes of the second assistant features are substantially perpendicular with each other.

13. The method of claim 8, further comprising:
   determining if the projected pattern is acceptable in comparison with the design layout; and
   making the integrated circuit by the photomask when the projected pattern is acceptable.

14. The method of claim 13, after determining if the projected pattern is acceptable and before making the integrated circuit, further comprising:
   calibrating an OPC model with the projected pattern if the projected pattern is not acceptable.

15. The method of claim 14, further comprising:
   adding a plurality of calibrated assistant features on the design layout to form a first revised layout;
   adding a plurality of calibrated OPC features on the first revised layout to form a second revised layout;
   forming a revised photomask according to the second revised layout;
   patterning a wafer having a photoresist by the revised photomask to form a revised projected pattern; and
   determining if the revised projected pattern is acceptable in comparison with the design layout.

16. A method for fabricating an integrated circuit, comprising:
   providing a first photomask having a first layout, wherein the first layout comprises a test pattern and the test pattern comprises a plurality of first main features and a plurality of first assistant features;
   patterning a first wafer having a first photoresist by the first photomask to form a first projected pattern that includes a plurality of dimples on a top surface of the first photoresist;
   calculating a difference between the test pattern and the first projected pattern to determine an assistant feature design rule;
   providing a second layout having a plurality of second main features;
   adding a plurality of second assistant features in an assistant region of the second layout to form a third layout, wherein the second assistant features are added according to the assistant feature design rule; and
   forming a second photomask according to the third layout.

17. The method of claim 16, further comprising:
   patterning a second wafer having a second photoresist by the second photomask to form a second projected pattern;
   determining if the second projected pattern is acceptable in comparison with the third layout; and
   making the integrated circuit by the second photomask when the second projected pattern is acceptable.

18. The method of claim 16, wherein the second assistant features are sub-resolution features.

19. The method of claim 16, wherein the assistant region has no second main feature and a width of the assistant region is larger than five times of a width of the second main feature.

20. The method of claim 19, wherein the width of the assistant region is larger than 50 nm.

* * * * *